United States Patent
Wong et al.

(10) Patent No.: US 8,406,258 B1
(45) Date of Patent: Mar. 26, 2013

(54) APPARATUS AND METHODS FOR LOW-JITTER TRANSCEIVER CLOCKING

(75) Inventors: Wilson Wong, San Francisco, CA (US);
Tim Tri Hoang, San Jose, CA (US);
Thungoc M. Tran, San Jose, CA (US);
Sergey Shumarayev, Los Altos Hills, CA (US); Allen Chan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 462 days.

(21) Appl. No.: 12/752,984

(22) Filed: Apr. 1, 2010

(51) Int. Cl.
*H04J 3/06* (2006.01)
(52) U.S. Cl. ........................................................ 370/516
(58) Field of Classification Search ...................... None
See application file for complete search history.

(56) References Cited

U.S. PATENT DOCUMENTS

| | | | |
|---|---|---|---|
| 5,648,964 A * | 7/1997 | Inagaki et al. ................. | 370/228 |
| 6,888,376 B1 | 5/2005 | Venkata et al. | |
| 7,131,024 B1 | 10/2006 | Venkata et al. | |
| 7,272,677 B1 | 9/2007 | Venkata et al. | |
| 7,538,578 B2 | 5/2009 | Venkata et al. | |
| 7,639,054 B1 | 12/2009 | Burney | |
| 7,656,187 B2 | 2/2010 | Tran et al. | |
| 7,821,343 B1 * | 10/2010 | Wong et al. ........................ | 331/2 |
| 7,859,329 B1 * | 12/2010 | Starr et al. ..................... | 327/565 |
| 2002/0011902 A1 * | 1/2002 | Ipek et al. ........................ | 331/17 |
| 2002/0105386 A1 * | 8/2002 | Shastri ............................. | 331/11 |
| 2003/0097600 A1 * | 5/2003 | Wong .............................. | 713/400 |
| 2003/0190003 A1 * | 10/2003 | Fagerhoj ........................ | 375/372 |
| 2005/0239417 A1 * | 10/2005 | Boos ............................... | 455/86 |
| 2006/0250168 A1 * | 11/2006 | Starr et al. ..................... | 327/147 |
| 2007/0019766 A1 * | 1/2007 | Bereza et al. .................. | 375/354 |
| 2007/0052485 A1 * | 3/2007 | Loke et al. ....................... | 331/16 |
| 2007/0058618 A1 * | 3/2007 | Tran et al. ..................... | 370/370 |
| 2007/0105518 A1 * | 5/2007 | Chang et al. .................. | 455/260 |
| 2007/0237186 A1 | 10/2007 | Shumarayev et al. | |
| 2008/0036506 A1 * | 2/2008 | Lam et al. ........................ | 327/45 |
| 2008/0181336 A1 * | 7/2008 | Maxim .......................... | 375/340 |
| 2009/0088113 A1 * | 4/2009 | Marsili et al. .................. | 455/260 |
| 2009/0257445 A1 | 10/2009 | Chan et al. | |
| 2010/0002226 A1 * | 1/2010 | Hartog .......................... | 356/73.1 |
| 2010/0073051 A1 * | 3/2010 | Rao et al. ....................... | 327/157 |
| 2010/0191814 A1 * | 7/2010 | Heddes et al. ................. | 709/206 |
| 2010/0194471 A1 * | 8/2010 | Raghunathan et al. ....... | 327/596 |
| 2011/0032040 A1 * | 2/2011 | Beghini ........................... | 331/2 |

* cited by examiner

*Primary Examiner* — Otis L Thompson, Jr.
(74) *Attorney, Agent, or Firm* — Okamoto & Benedicto LLP (57) ABSTRACT

One embodiment relates to an integrated circuit which includes multiple communication channels, a clock multiplexer in each channel, two low-jitter clock generator circuits, and clock distribution circuitry. Each channel includes circuitry arranged to communicate a serial data stream using a reference clock signal, and the clock multiplexer in each channel is configured to select the reference clock signal from a plurality of input clock signals. The first low-jitter clock generator circuit is arranged to generate a first clock signal using a first inductor-capacitor-based oscillator circuit, and the second low-jitter clock generator circuit is arranged to generate a second clock signal using a second inductor-capacitor-based oscillator circuit The first and second inductor-capacitor-based oscillator circuits have different tuning ranges. The clock distribution circuitry is arranged to input the first and second low-jitter clock signals to each said clock multiplexer. Other embodiments and features are also disclosed.

19 Claims, 8 Drawing Sheets

APPARATUS AND METHODS FOR LOW-JITTER TRANSCEIVER CLOCKING

BACKGROUND

1. Technical Field

The present invention relates generally to high-speed serial interfaces for integrated circuits.

2. Description of the Background Art

There is increasing interest in the use of high-speed serial data communication for exchange of data between the devices that make up various types of systems. There are many possible protocols for such high-speed serial communication. Some of these protocols may be industry-standard protocols. Other protocols may be custom-designed for particular systems.

A particular protocol typically involves such things as how is the data formatted; how many channels are used together to provide the overall communication link; at what speed (serial data rate or bit rate) is a channel operated; if multiple channels are employed to provide a link, how much skew (differential delay) can there be between the channels; and so forth.

Examples of industry-standard protocols include PCI Express®(Peripheral Component Interconnect Express) and XAUI (X Attachment Unit Interface). PCI Express® is a point-to-point serial interface introduced by Intel Corporation of Santa Clara, Calif., and may be used, for example, as an expansion card interface for computer systems. XAUI is a 10 gigabit per second serial interface which may be used, for example, as a chip-to-chip interface.

SUMMARY

One embodiment relates to an integrated circuit which includes multiple communication channels, a clock multiplexer in each channel, two low-jitter clock generator circuits, and clock distribution circuitry. Each channel includes circuitry arranged to communicate a serial data stream using a reference clock signal, and the clock multiplexer in each channel is configured to select the reference clock signal from a plurality of input clock signals. The first low-jitter clock generator circuit is arranged to generate a first low-jitter clock signal using a first inductor-capacitor-based oscillator circuit, and the second low-jitter clock generator circuit is arranged to generate a second low-jitter clock signal using a second inductor-capacitor-based oscillator circuit The first and second inductor-capacitor-based oscillator circuits have different tuning ranges. The clock distribution circuitry is arranged to input the first and second low-jitter clock signals to each said clock multiplexer.

Another embodiment relates to a method of providing a configurable high-speed serial interface in an integrated circuit. A first low-jitter clock signal is generated by a first low-jitter clock generator using a first inductor-capacitor-based oscillator, and a second low-jitter clock signal is generated by a second low-jitter clock generator using a second inductor-capacitor-based oscillator, wherein the tuning ranges of the first and second inductor-capacitor-based oscillators are different from each other. The first and second low-jitter clock signals are distributed by way of clock buses to a plurality of clock multiplexers, each clock multiplexer being within a corresponding communication channel. Said clock multiplexers select reference clock signals for use within the corresponding communication channels.

Another embodiment relates to a high-speed serial interface for an integrated circuit. The interface includes a plurality of low-jitter clock generator circuits, a plurality of communication channels, and clock distribution circuitry. Each low-jitter clock generator circuit includes a low-jitter phase-locked loop with a different tuning range. Each channel includes a clock multiplexer which is configured to select a reference clock signal from multiple input clock signals and also includes a clock data recovery unit which is arranged to receive a serial data stream and phase-align the selected reference clock signal to transitions in the serial data stream so as to recover a data signal. The clock distribution circuitry is arranged to distribute the low-jitter clock signals from the low-jitter clock generator circuits to each clock multiplexer.

Other embodiments and features are also disclosed.

DETAILED DESCRIPTION

Applicants have determined that conventional apparatus and methods for supporting multiple high-speed serial interfaces have various limitations or drawbacks. One limitation is that it is difficult or problematic to support the different data rates of the various industry standards or protocols, particularly when those protocols require low-jitter clock performance. Examples of protocols requiring tighter jitter specifications (i.e. low-jitter performance) include PCI Express® and Common Electrical I/O (CEI).

The present application discloses advantageous apparatus and methods to overcome the above-discussed limitation so as to efficiently support multiple data rates of various high-speed protocols. The technique disclosed herein uses an innovative clocking structure and relatively few low-jitter clock-generator clock management units (LC CMUs).

The LC CMUs are specifically arranged with inductor (L)-capacitor (C)-based voltage controlled oscillators (LC VCOs) to support tighter jitter specifications as required to meet certain industry standards and protocols. An LC VCO uses 2 passive components: an inductor (L) and a capacitor (C). These 2 components are coupled to form a band pass filter. An LC VCO has a much more selective frequency range, and thus less phase noise, than a ring VCO. This more selective tuning range limits the range of frequencies that an LC VCO can support, but also gives the LC VCO less phase noise and thus less jitter.

In other words, the tighter filtering characteristics of a PLL with an LC VCO lead to improved jitter performance (i.e. to reduced jitter) in the clock output signals. However, a drawback to using LC VCOs is that the tuning (frequency) range supported by an LC VCO is limited. For instance, an LC VCO may be arranged to operate with low-jitter at a frequency range of 5 to 6 gigahertz (GHz). Outside of that frequency range, the LC VCO does not have low-jitter performance. This limited tuning range for an LC VCO makes it problematic to support the various data rates of different high-speed serial interface protocols.

For example, PCI Express® generation 1 uses a data rate of 2.5 Gbps (gigabits per second) which corresponds to a frequency of 2.5 GHz per channel, PCI Express® generation 2 uses a data rate of 5 Gbps which corresponds to a frequency of 5 GHz per channel, and PCI Express generation 3 uses a data rate of 8 Gbps which corresponds to a frequency of 8 GHz per channel. As such, an LC CMU operating with a frequency range of 5 to 6 GHz would be capable of supporting PCI Express generation 2 since the LC CMU is arranged to operate with low-jitter performance at 5 GHz, and it would also be capable of supporting generation 1 by using a divide-by-two circuit to reduce the frequency from 5 GHz to 2.5 GHz.

However, supporting PCI Express® generation 3 is problematic with the 5-6 GHz LC CMU. This is because the highest frequency of 6 GHz for the LC CMU is insufficient to support the 8 Gbps data rate for generation 3. Furthermore, supporting another protocol requiring low-jitter clock performance at 3.5 GHz, for example, would also be problematic with the 5-6 GHz LC CMU. This is because there is no integer divisor to reduce a frequency in the range of 5-6 GHz to the required 3.5 GHz frequency.

The present application discloses apparatus and methods which use two or more types of LC CMUs to support many different data rates which are required by various protocols requiring low-jitter clock performance. In addition to divider circuits to reduce the output frequencies by integer divisors, the different types of LC CMUs have LC VCOs with different tuning ranges. Furthermore, the circuitry includes a clocking structure which interconnects any of the different types of LC CMUs to any of the transceiver channels.

Two LC CMUs with Different Tuning Ranges

Figure 1A:
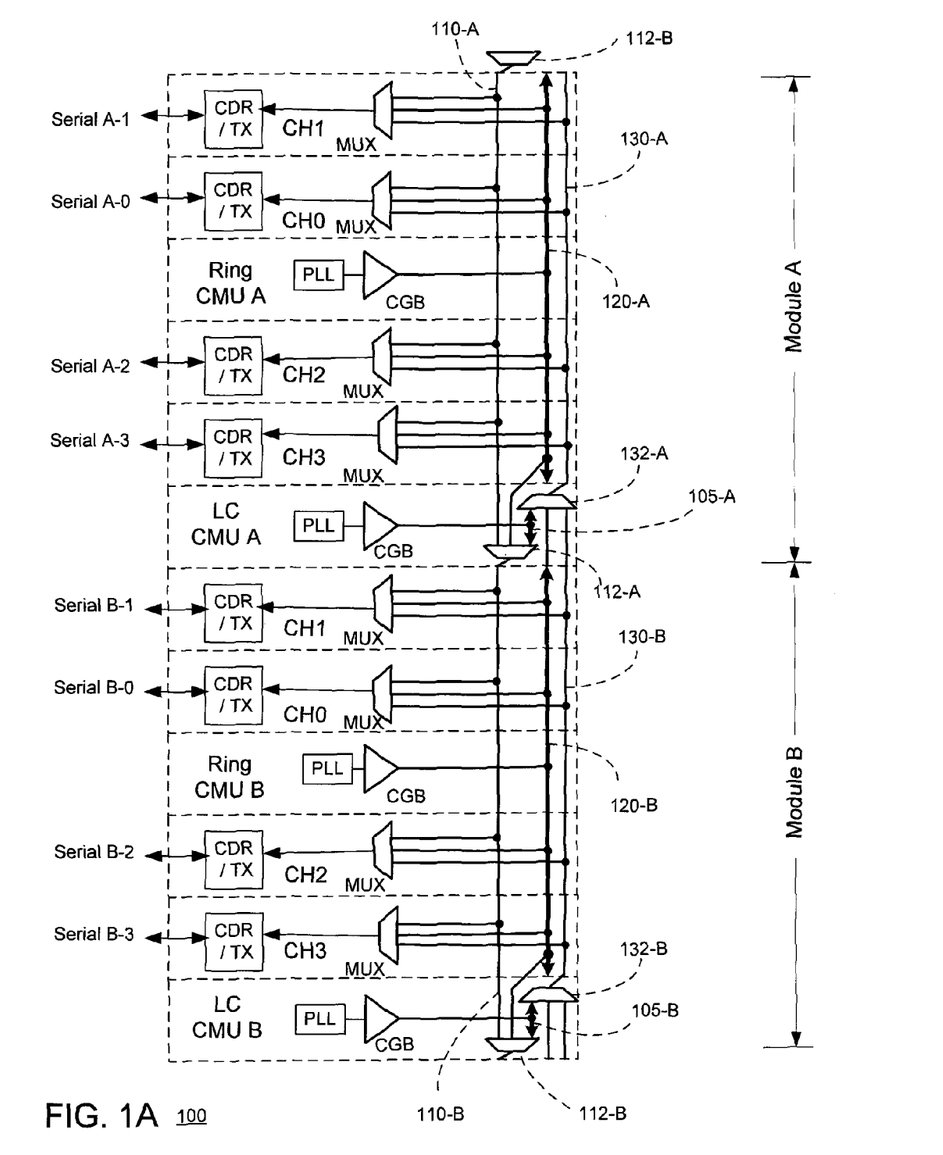
FIG. 1A is a schematic diagram of physical media attachment (PMA) circuitry for implementing high-speed serial interfaces in accordance with an embodiment of the invention.

FIG. 1A is a schematic diagram of physical media attachment (PMA) circuitry 100 for implementing high-speed serial interfaces in accordance with an embodiment of the invention. In this example, the PMA circuitry includes two groups or modules (A and B) of four channels each, two ring clock multiplier units (Ring CMU A and Ring CMU B), and two types of low-jitter clock-generation CMUs (LC CMU A and LC CMU B). Note that in other embodiments, the PMA modules may include a different number of channels, and the particular arrangement of circuit blocks may be modified.

The ring CMUs are arranged with ring oscillators and are capable of supporting a wide range of data rates. However, the clock signals generated by the ring CMUs do not have low jitter. As such, the ring CMUs and related circuitry may be used to support protocols which do not require tight (i.e. low) jitter specifications. On the other hand, the LC CMUs are specifically arranged with inductor-capacitor-based voltage controlled oscillators (LC VCOs) to support tighter jitter specifications as required to meet certain industry standards and protocols. The tighter filtering characteristics of an LC VCO lead to improved jitter performance (i.e. lead to reduced jitter).

In accordance with the embodiment depicted in FIG. 1A, LC CMU A and LC CMU B have LC VCOs with different frequency (tuning) ranges and have configurable divider circuits which may reduce the output frequencies by integer divisors. In addition, a configurable clocking network is arranged such that each channel in modules A and B may receive a low-jitter clock signal from either LC CMU A or LC CMU B.

In a particular implementation, LC CMU A may utilize a low-jitter inductor-capacitor-based (LC) oscillator with a tuning range of 5 to 6 gigahertz (GHz), and LC CMU B may utilize a low-jitter LC oscillator with a tuning range of 8 to 10 GHz. In addition, LC CMU A and B may each include a divide-by-two circuit such that the frequency of the low-jitter clock signal may be reduced to a range of 2.5 to 3 GHz (half of 5 to 6 GHz) for LC CMU A and 4 to 5 GHz for LC CMU B (half of 8 to 10 GHz). Hence, LC CMU A may be configured to output a frequency in the ranges of 5 to 6 GHz or 2.5 to 3 GHz, and LC CMU B may be configured to output a frequency in the ranges of 8 to 10 GHz or 4 to 5 GHz. Using a configurable clocking tree as shown in FIG. 1A, this implementation may be configured to provide any of the low-jitter clock signals to any of the transceiver channels in modules A and B.

As such, this particular implementation may support PCI Express® generations 1, 2, and 3 which require low-jitter clock signals of 2.5 GHz, 5 GHz, and 8 GHz, respectively. This implementation may also support various other protocols which require a low-jitter clock signal with a frequency within the ranges of 2.5 to 3 GHz, 4 to 6 GHz, and 8 to 10 GHz. Additional LC CMUs and further divide-by-integer circuitry may be included so as to further extend the frequency ranges supported.

In FIG. 1A, the four transceiver channels within each module are labeled CH0, CH1, CH2, and CH3. As shown, channels CH0, CH1, CH2, and CH3 in module A are arranged to receive/transmit serial streams of data via channels A-0, A-1, A-2, and A-3, respectively. Similarly, CH0, CH1, CH2, and CH3 in module B are arranged to receive/transmit serial streams of data via channels B-0, B-1, B-2, and B-3, respectively. Within each channel, the received serial data streams are received and processed by a clock and data recovery (CDR) unit, and the transmitted serial data streams are generated by a transmission (TX) unit. Each CDR unit functions as a deserializer and converts the received serial data into parallel data for decoding and further processing, while each TX unit functions as a serializer and converts encoded parallel data into serial data for transmission.

As further shown in FIG. 1A, each CDR/TX unit utilizes a clock signal which is provided by a corresponding clock multiplexer (MUX) for the channel. The MUX selects one of multiple clock inputs. In the particular embodiment shown, the MUX selects one of three clock inputs.

For the four MUXes in module A, a first clock input is provided on line 110-A by multiplexer 112-B (in the above module B), a second clock input is a clock output from Ring CMU A which is provided by bus 120-A, and a third clock input is provided on line 130-A by multiplexer 132-A.

Multiplexer 112-B (in the above module B) is arranged to select one clock signal from amongst these three clock signals (all from the above module B): a clock signal on line 110-B; a clock output from Ring CMU B which is on bus 120-B; and a low-jitter clock output from LC CMU B which is on bus 105-B.

Multiplexer 132-A is arranged to select one clock signal from amongst these three clock signals: a low-jitter clock output from LC CMU A which is on bus 105-A; a clock output from Ring CMU B which is on bus 120-B (in the lower module B); and a clock signal on line 130-B which is output by multiplexer 132-B (in the lower module B).

For the four MUXes in module B, a first clock input is provided on line 110-B by multiplexer 112-A (in the above module A), a second clock input is a clock output from Ring CMU B which is provided by bus 120-B, and a third clock input is provided on line 130-B by multiplexer 132-B.

Multiplexer 112-A (in the above module A) is arranged to select one clock signal from amongst these three clock signals (all from the above module A): the clock signal on line 110-A; a clock output from Ring CMU A which is on bus 120-A; and a low-jitter clock output from LC CMU A which is on bus 105-A.

Multiplexer 132-B is arranged to select one clock signal from amongst these three clock signals: a low-jitter clock output from LC CMU B which is on bus 105-B; a clock output from Ring CMU A which is on bus 120-A (in the lower module A); and a clock signal on line 130-A which is output by multiplexer 132-A (in the lower module A).

Figure 1B:
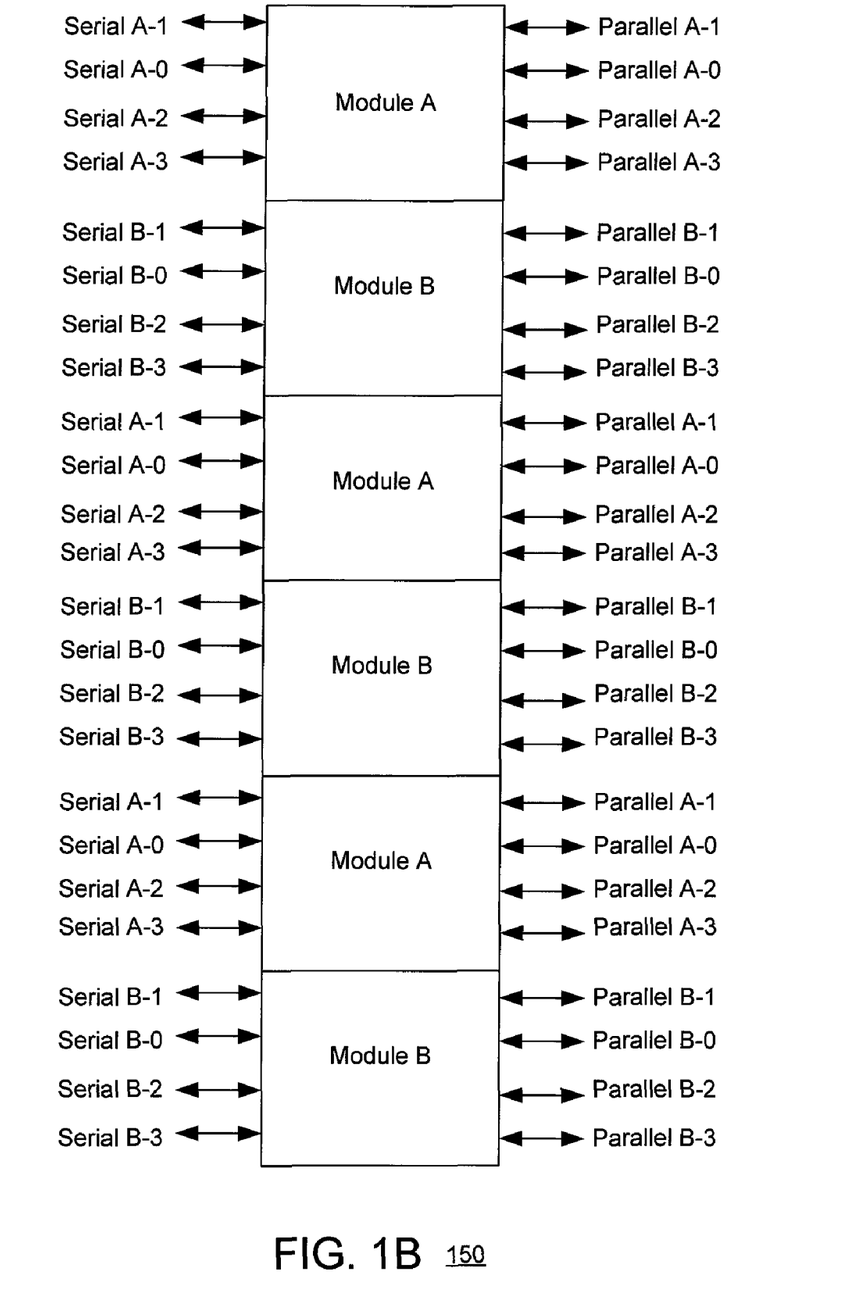
FIG. 1B is a high-level diagram of the PMA modules in an array in accordance with an embodiment of the invention.

FIG. 1B shows an array 150 of the PMA modules of FIG. 1A as they may be arranged in accordance with an embodiment of the invention. In the array shown, the modules A and B may alternate in the array. As further shown, the modules convert serial data received from physical transmission media to parallel data. The parallel data may be output to physical coding sublayer (PCS) circuit modules for digital processing. The modules may also convert parallel data received PCS circuit modules to serial data for transmission.

Three LC CMUs with Different Tuning Ranges

Figure 2A:
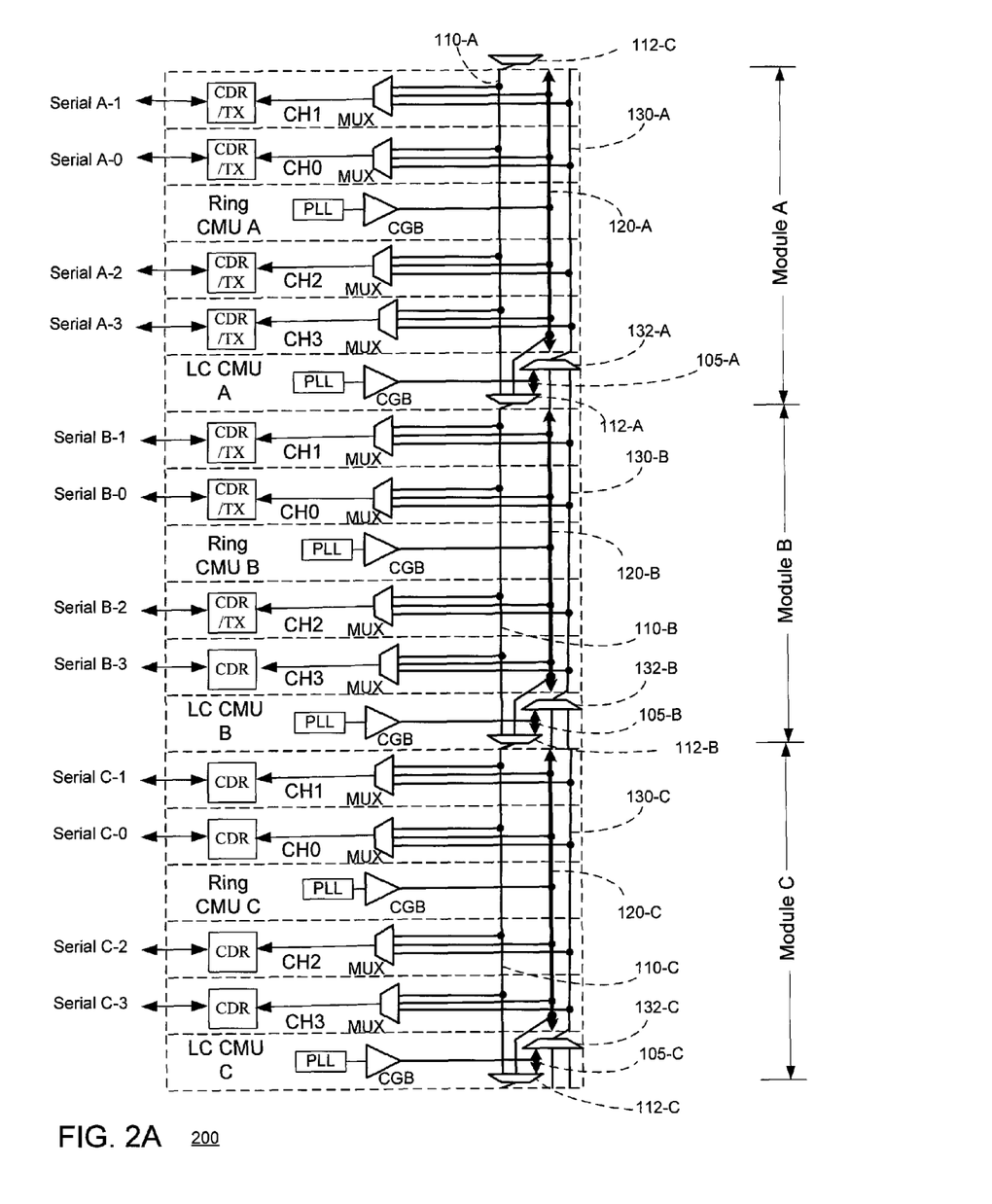
FIG. 2A is a schematic diagram of PMA circuitry for implementing high-speed serial interfaces in accordance with another embodiment of the invention.

FIG. 2A is a schematic diagram of PMA circuitry 200 for implementing high-speed serial interfaces in accordance with another embodiment of the invention. In this example, the PMA circuitry includes three groups or modules (A, B and C) of four channels each, three ring clock multiplier units (Ring CMU A, Ring CMU B and Ring CMU C), and three low-jitter clock-generation CMUs (LC CMU A, LC CMU B and LC CMU C). Note that in other embodiments, the PMA modules may include a different number of channels, and the particular arrangement of circuit blocks may be modified.

In accordance with the embodiment depicted in FIG. 2A, LC CMU A, LC CMU B, and LC CMU C have LC VCOs with different frequency (tuning) ranges and have configurable divider circuits which may reduce the output frequencies by integer divisors. In addition, a configurable clocking network is arranged such that each channel in modules A, B and C may receive a low-jitter clock signal from LC CMU A, LC CMU B, or LC CMU C.

In a particular implementation, LC CMU A may utilize a low-jitter LC oscillator with a tuning range of 5 to 6 gigahertz (GHz), LC CMU B may utilize a low-jitter LC oscillator with a tuning range of 8 to 10 GHz, and LC CMU C may utilize a low-jitter LC oscillator with a tuning range of 6 to 8 GHz. In addition, LC CMU A, B and C may each include a divide-by-two circuit such that the frequency of the low-jitter clock signal may be reduced to a range of 2.5 to 3 GHz (half of 5 to 6 GHz) for LC CMU A, 4 to 5 GHz (half of 8 to 10 GHz) for LC CMU B, and 3 to 4 GHz (half of 6 to 8 GHz) for LC CMU C. Hence, LC CMU A may be configured to output a frequency in the ranges of 5 to 6 GHz or 2.5 to 3 GHz, LC CMU B may be configured to output a frequency in the ranges of 8 to 10 GHz or 4 to 5 GHz, and LC CMU C may be configured to output a frequency in the ranges of 6 to 8 GHz or 3 to 4 GHz. Using a configurable clocking tree as shown in FIG. 2A, this implementation may be configured to provide each of the low-jitter clock signals to any of the transceiver channels in modules A, B and C.

As such, this particular implementation may support a protocol which requires a low-jitter clock signal anywhere in the continuous frequency range from 2.5 GHz to 10 GHz. Additional divide-by-integer circuits may be utilized within each LC CMU so as to further extend the continuous frequency range supported. For instance, if divide-by-two and divide-by-four circuitry is included within each LC CMU, then this implementation may support a protocol which requires a low-jitter clock signal anywhere in the continuous frequency range from 1.25 GHz to 10 GHz. Going further, if divide-by-two, divide-by-four, and divide-by-eight circuitry is included within each LC CMU, then this implementation may support a protocol which requires a low-jitter clock signal anywhere in the continuous frequency range from 1.25 GHz to 10 GHz. And so forth.

Similar to FIG. 1A, the four transceiver channels within each module are labeled CH0, CH1, CH2, and CH3. As shown, channels CH0, CH1, CH2, and CH3 in module A are arranged to receive/transmit serial streams of data via channels A-0, A-1, A-2, and A-3, respectively. Similarly, CH0, CH1, CH2, and CH3 in module B are arranged to receive/transmit serial streams of data via channels B-0, B-1, B-2, and B-3, respectively, and CH0, CH1, CH2, and CH3 in module C are arranged to receive/transmit serial streams of data via channels C-0, C-1, C-2, and C-3, respectively. Within each channel, the received serial data streams are received and processed by a CDR unit, and the transmitted serial data streams are generated by a TX unit. Each CDR unit functions as a deserializer and converts the received serial data into parallel data for decoding and further processing, while each TX unit functions as a serializer and converts encoded parallel data into serial data for transmission.

As further shown in FIG. 2A, each CDR/TX unit utilizes a clock signal which is provided by a corresponding clock multiplexer (MUX) for the channel. The MUX selects one of multiple clock inputs. In the particular embodiment shown, the MUX selects one of three clock inputs.

For the four MUXes in module A, a first clock input is provided on line 110-A by multiplexer 112-C (in the module C above), a second clock input is a clock output from Ring CMU A which is provided by bus 120-A, and a third clock input is provided on line 130-A by multiplexer 132-A.

Multiplexer 112-C (in the module C above) is arranged to select one clock signal from amongst these three clock signals (all from the module C above): a clock signal on line 110-C; a clock output from Ring CMU C which is on bus 120-C; and a low-jitter clock output from LC CMU C which is on bus 105-C.

Multiplexer 132-A is arranged to select one clock signal from amongst these three clock signals: a low-jitter clock output from LC CMU A which is on bus 105-A; a clock output from Ring CMU B which is on bus 120-B; and a clock signal on line 130-B which is output by multiplexer 132-B.

For the four MUXes in module B, a first clock input is provided on line 110-B by multiplexer 112-A, a second clock input is a clock output from Ring CMU B which is provided by bus 120-B, and a third clock input is provided on line 130-B by multiplexer 132-B.

Multiplexer 112-A is arranged to select one clock signal from amongst these three clock signals: the clock signal on line 110-A; a clock output from Ring CMU A which is on bus 120-A; and a low-jitter clock output from LC CMU A which is on bus 105-A.

Multiplexer 132-B is arranged to select one clock signal from amongst these three clock signals: a low-jitter clock output from LC CMU B which is on bus 105-B; a clock output from Ring CMU C which is on bus 120-C (in the module C below); and a clock signal on line 130-C which is output by multiplexer 132-C (in the module C below).

For the four MUXes in module C, a first clock input is provided on line 110-C by multiplexer 112-B, a second clock input is a clock output from Ring CMU C which is provided by bus 120-C, and a third clock input is provided on line 130-C by multiplexer 132-C.

Multiplexer 112-B is arranged to select one clock signal from amongst these three clock signals: the clock signal on line 110-B; a clock output from Ring CMU B which is on bus 120-B; and a low-jitter clock output from LC CMU B which is on bus 105-B.

Multiplexer 132-C is arranged to select one clock signal from amongst these three clock signals: a low-jitter clock output from LC CMU C which is on bus 105-C; a clock output from Ring CMU A which is on bus 120-A (in the module A below); and a clock signal on line 130-A which is output by multiplexer 132-A (in the module A below).

Figure 2B:
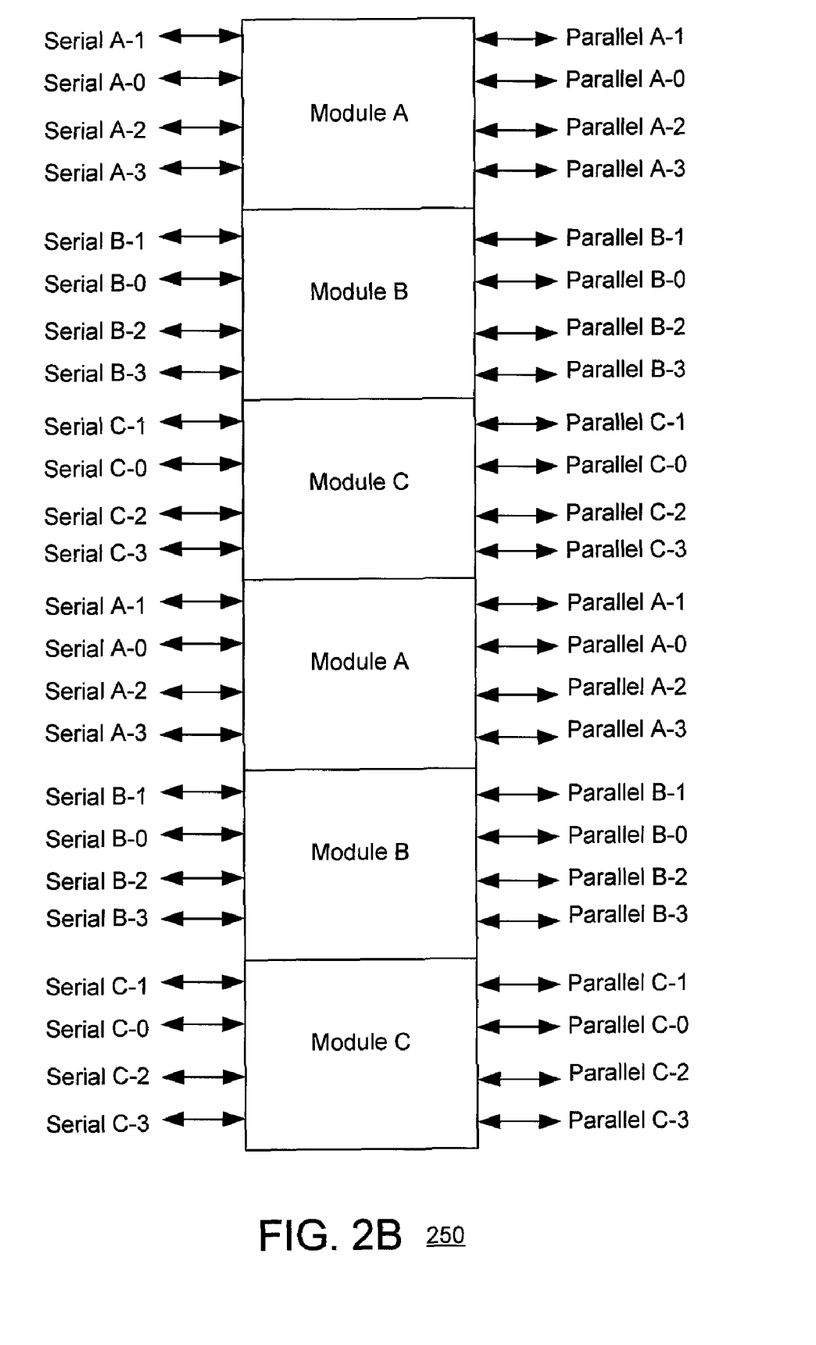
FIG. 2B is a high-level diagram of the PMA modules in an array in accordance with an embodiment of the invention.

FIG. 2B shows an array 250 of the PMA modules of FIG. 2A as they may be arranged in accordance with an embodiment of the invention. As shown, a set including modules A, B, and C may be repeated in the array. As further shown, the modules convert serial data received from physical transmission media to parallel data. The parallel data may be output to PCS circuit modules for digital processing. The modules may also convert parallel data received PCS circuit modules to serial data for transmission.

Note that while the channels in FIGS. 1A, 1B, 2A and 2B are shown as transceiver channels with both transmission and reception capabilities. In other embodiments, some of the channels may be receiver only channels, with reception but not transmission capabilities, and/or some of the channels may be transmitter only channels, with transmission but not reception capabilities. A receiver only channel would require a CDR unit (but not a TX unit), while a transmitter only channel would require a TX unit (but not a CDR unit).

Figure 3:
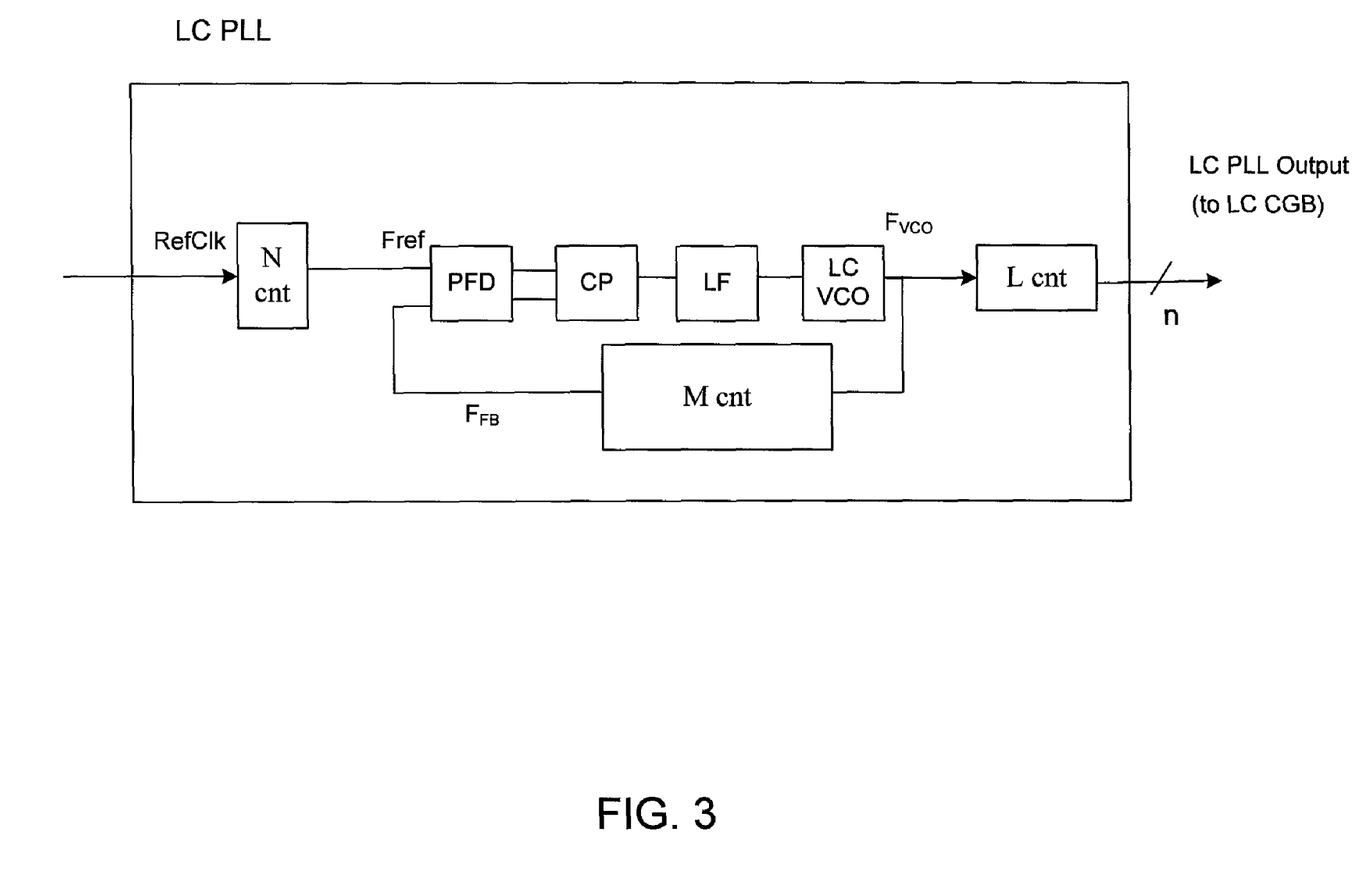
FIG. 3 is a schematic diagram of a low-jitter inductor-capacitor-based phase-locked loop (LC PLL) circuit in accordance with an embodiment of the invention.

FIG. 3 is a schematic diagram of a low-jitter inductor-capacitor-based phase-locked loop (LC PLL) circuit in accordance with an embodiment of the invention. Alternate implementations of the LC PLL may be utilized in other embodiments.

As shown in FIG. 3, the circuits within each LC PLL may include, for example, a pre-scale divide counter (N cnt), a phase frequency detector (PFD), a charge pump (CP), a loop filter (LF), a low-jitter inductor (L)-capacitor (C)-based voltage-controlled oscillator (LC VCO), a feedback divide counter (M cnt), and post-scale divide counters (L cnt). Various other circuits are not shown but may also be included, such as, for example, control circuitry, design-for-test circuitry, compensation circuitry, dynamic phase-shift circuitry, lock detection circuitry, and other circuitry.

The pre-scale divide counter (N cnt) may be arranged to receive an input reference clock (RefClk) and to output a lower-frequency reference clock ($F_{ref}$) which is fed to the PFD. The PFD may be arranged to output "up" and "down" signals to the CP. If the CP receives an up signal, current is driven into the LF. If the CP receives a down signal, current is drawn from the LF. The LF effectively converts these signals to a control voltage that is used to bias the LC VCO.

The LC VCO oscillates at a higher or lower frequency based on the control voltage from the LF. This affects the phase and frequency of the feedback clock ($F_{FB}$) which is fed back into the phase frequency detector. The feedback divide counter (M cnt) may be arranged in the feedback loop to increase the VCO frequency above the frequency of the reference clock ($F_{ref}$). The frequency output of the LC VCO ($F_{VCO}$) may be transmitted to the post-scale divide counters (L cnt), and the output of that counter may be sent to the corresponding clock generation buffer (LC CGB).

Figure 4:
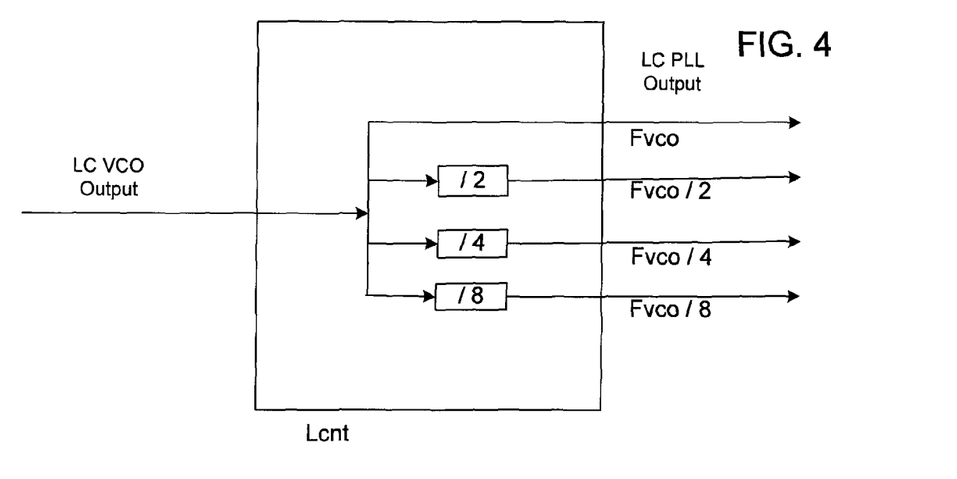
FIG. 4 is a schematic diagram of a post-scale counter which is arranged to have multiple counters so as to output multiple frequencies in accordance with an embodiment of the invention.

The outputs of the post-scale divide counters (Lcnt) may include n low-jitter clock signals, where n is at least two. For example, n may be four, and Lcnt may be configured with three counters and one pass through line as shown in FIG. 4. In the example shown, the three counters include a divide-by-two counter, a divide-by-four counter, and a divide-by-eight counter.

The divide-by-two counter generates a frequency of Fvco/2, The divide-by-four counter generates a frequency of Fvco/4, and the divide-by-eight counter generates a frequency of Fvco/8. More generally, a divide-by-L counter may be included so as to generate a clock signal of Fvco/L.

In the example implementation of FIG. 4, the outputs of the LC PLL include a first low-jitter clock signal at frequency Fvco, a second low-jitter clock signal at frequency Fvco/2, a third low-jitter clock signal at frequency Fvco/4, and a fourth low-jitter clock signal at frequency Fvco/8. These low-jitter clock signals may be input to the LC CGB.

Figure 5:
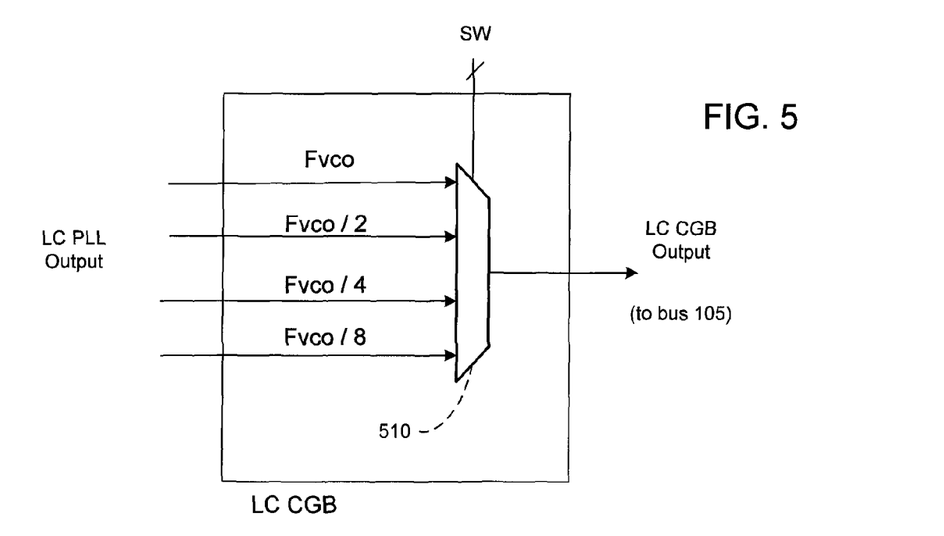
FIG. 5 is a schematic diagram of a low-jitter clock-generation buffer which is configurable to output one of two frequencies in accordance with an embodiment of the invention.

FIG. 5 a schematic diagram of a low-jitter clock generation buffer (LC CGB) which is configurable to output one of a plurality of low-jitter frequency signals in accordance with an embodiment of the invention. In the particular implementation shown in FIG. 5, four low-jitter clock signals are output by the LC PLL and input into the four-to-one multiplexer 510. These low-jitter clock signals have frequencies of Fvco, Fvco/2, Fvco/4, and Fvco/8. In other implementations the number of low-jitter clock signals may be fewer or more than four, and the frequencies may generally be Fvco/L, where L is a counting number (i.e. 1, 2, 3, 4, 5, 6, 7, and so on).

The multiplexer 510 may be controlled by a configurable control signal (SW) to selectively output one of the low-jitter clock signals. The selected low-jitter clock signal is output to the corresponding clock bus 105.

Figure 6:
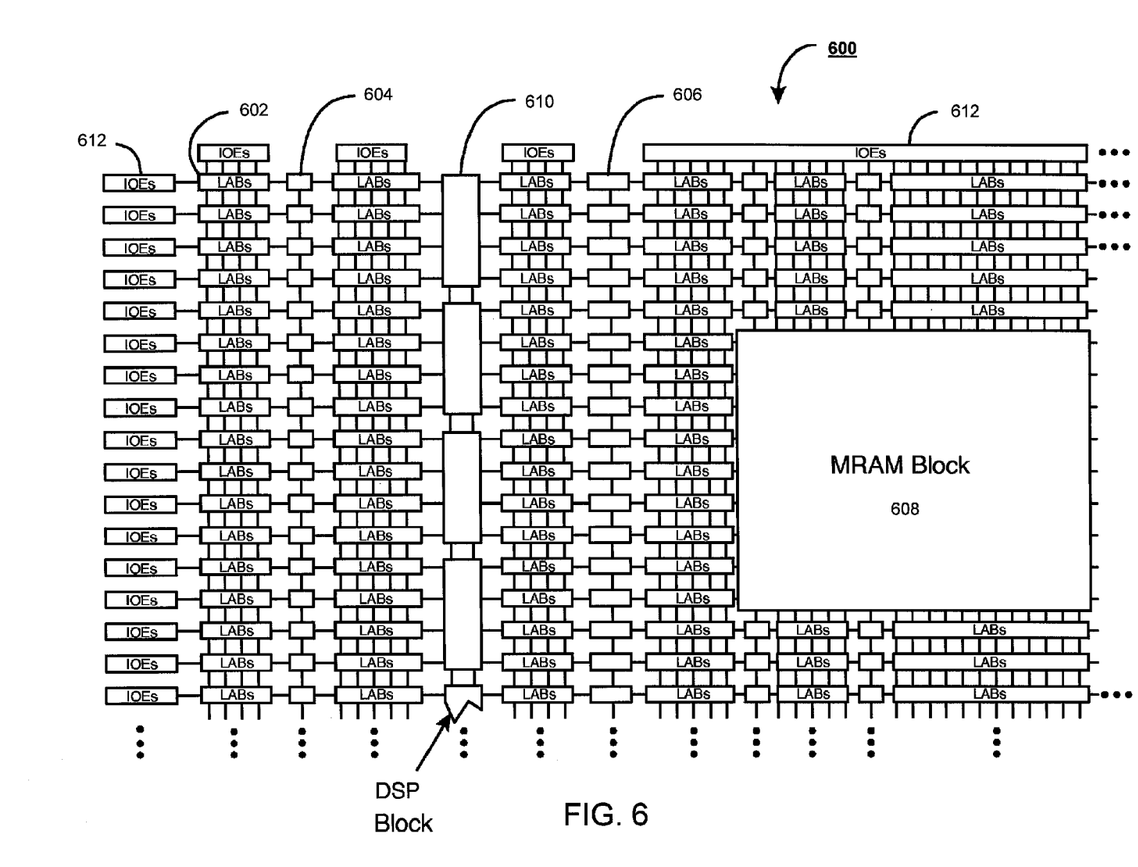
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and FIFO buffers.

FPGA 600 further includes digital signal processing (DSP) blocks 610 that can implement, for example, multipliers with add or subtract features. Input/output elements (IOEs) 612 located, in this example, around the periphery of the chip support numerous single-ended and differential input/output standards. Each IOE 612 is coupled to an external terminal (i.e., a pin) of FPGA 600. It is to be understood that FPGA 600 is described herein for illustrative purposes only and that the present invention can be implemented in many different types of PLDs, FPGAs, and ASICs.

Figure 7:
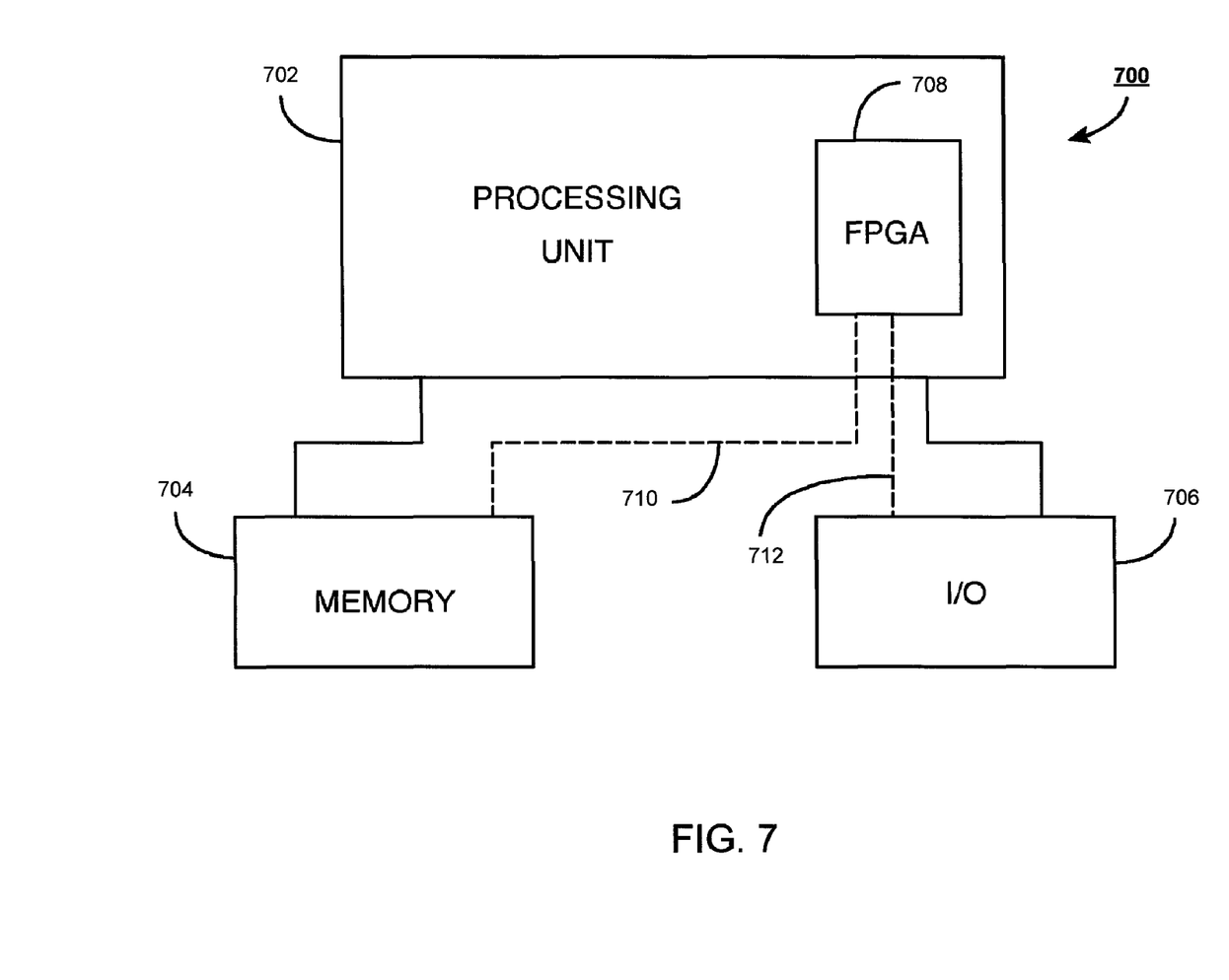
FIG. 7 is a block diagram of an exemplary digital system that can employ techniques of the present invention.

The present invention can also be implemented in a system that has a FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, FPGA 708 is embedded in processing unit 702. FPGA 708 can serve many different purposes within the system in FIG. 8. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar function. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternately, FPGA 708 can itself include an embedded microprocessor. Memory unit 704 can be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit with a configurable high-speed serial interface, the integrated circuit comprising:
   a plurality of communication channels, each channel including circuitry arranged to communicate a serial data stream using a reference clock signal, wherein the plurality of channels are grouped into a plurality of modules, each module comprising multiple channels;
   a clock multiplexer in each channel which is configured to select the reference clock signal from a plurality of input clock signals;
   a ring clock multiplication unit in each module which is arranged to output a clock signal;
   a first low-jitter clock generator circuit using a first inductor-capacitor-based oscillator circuit to generate a first low-jitter clock signal;
   a second low-jitter clock generator circuit using a second inductor-capacitor-based oscillator circuit to generate a second low-jitter clock signal, wherein the first and second inductor-capacitor-based oscillator circuits have different tuning ranges; and
   clock distribution circuitry arranged to input the first and second low-jitter clock signals to each said clock multiplexer, wherein the clock distribution circuitry is further arranged to input said clock signal to the clock multiplexers for the channels in that module.

2. The integrated circuit of claim 1, further comprising:
   at least one divider circuit which is configured to reduce a frequency of a clock signal output by one of the inductor-capacitor-based oscillators by an integer divisor.

3. The integrated circuit of claim 1, wherein each module comprises four channels.

4. The integrated circuit of claim 1, wherein the tuning ranges of the first and second inductor-capacitor-based oscillators do not overlap.

5. The integrated circuit of claim 1, wherein the first inductor-capacitor-based oscillator has a tuning range of 8 GHz to 10 GHz, and the second inductor-capacitor-based oscillator has a tuning range of 5 GHz to 6 GHz.

6. The integrated circuit of claim 5, further wherein the first inductor-capacitor-based oscillator is tuned to 8 GHz and the second inductor-capacitor-based oscillator is tuned to 5 GHz.

7. The integrated circuit of claim 1, further comprising:
   at least one additional low-jitter clock generator circuit using an inductor-capacitor-based oscillator circuit to generate an additional low-jitter clock signal,
   wherein each said inductor-capacitor-based oscillator circuit has a different tuning range, and
   wherein the clock distribution circuitry is further arranged to input each said low-jitter clock signal to each said clock multiplexer.

8. The integrated circuit of claim 7, wherein the combined tuning ranges of said inductor-capacitor-based oscillator circuits form a continuous range of frequencies.

9. A method of providing a configurable high-speed serial interface in an integrated circuit, the method comprising:
   generating a first low-jitter clock signal by a first low-jitter clock generator using a first inductor-capacitor-based oscillator;
   generating a second low-jitter clock signal by a second low-jitter clock generator using a second inductor-capacitor-based oscillator, wherein the tuning ranges of the first and second inductor-capacitor-based oscillators are different from each other;

outputting a clock signal from a ring clock multiplication unit;

distributing the first low-jitter clock signal by way of a first clock bus to a plurality of clock multiplexers, each clock multiplexer being within a corresponding communication channel;

distributing the second low-jitter clock signal by way of a second clock bus to the plurality of clock multiplexers;

distributing the clock signal from the ring clock multiplication unit to the plurality of clock multiplexers; and selecting reference clock signals by said clock multiplexers for use within the corresponding communication channels.

10. The method of claim 9, further comprising:

receiving serial data streams by a plurality of clock data recovery circuits, each clock data recovery circuit being within one of said channels and being arranged to phase-align the selected reference clock signal to transitions in the serial data stream so as to recover a data signal therefrom.

11. The method of claim 9, further comprising:

receiving a byte stream by a plurality of transmitter circuits, each transmitter recovery circuit being within one of said channels and being arranged to utilize the selected reference clock signal for that channel to serialize the byte stream into a serial data stream.

12. The method of claim 9, wherein the first inductor-capacitor-based oscillator has a tuning range of 8 GHz to 10 GHz, and the second inductor-capacitor-based oscillator has a tuning range of 5 GHz to 6 GHz.

13. The method of claim 12, further comprising:

tuning the first inductor-capacitor-based oscillator to a frequency of 8 GHz; and tuning the second inductor-capacitor-based oscillator to a frequency of 5 GHz.

14. The method of claim 13, further comprising:

using a divide-by-two circuit to convert a low-jitter clock signal from 5 GHz to 2.5 GHz.

15. The method of claim 9, further comprising:

generating at least one additional low-jitter clock signal using at least one additional low-jitter clock generator, wherein each said inductor-capacitor-based oscillator has a different tuning range; and distributing each said low-jitter clock signal to each said clock multiplexer.

16. The method of claim 15, wherein the combined tuning ranges of said inductor-capacitor-based oscillators form a continuous range of frequencies.

17. A high-speed serial interface for an integrated circuit, the interface comprising:

a plurality of low-jitter clock generator circuits, each low-jitter clock generator circuit including a low-jitter phase-locked loop with a different tuning range;

a ring clock multiplication unit which is arranged to output a clock signal;

a plurality of communication channels, each channel including a clock multiplexer which is configured to select a reference clock signal from multiple input clock signals and also including a clock data recovery unit arranged to receive a serial data stream and phase-align the selected reference clock signal to transitions in the serial data stream so as to recover a data signal, wherein the plurality of channels are grouped into a plurality of modules, each module comprising multiple channels; and clock distribution circuitry arranged to distribute the low-jitter clock signals from the low-jitter clock generator circuits and the clock signal from the ring clock multiplication unit to each clock multiplexer.

18. The high-speed serial interface of claim 17, wherein the different tuning ranges together form a continuous range of frequencies.

19. The high-speed serial interface of claim 17, further comprising:

divider circuits which are configurable to reduce frequencies of clock signals output by the low-jitter phase-locked loops by an integer divisor so as form the low-jitter clock signals distributed by the clock distribution circuitry.

* * * * *